United States Patent
Huang et al.

(10) Patent No.: US 7,432,605 B2
(45) Date of Patent: Oct. 7, 2008

(54) OVERLAY MARK, METHOD FOR FORMING THE SAME AND APPLICATION THEREOF

(75) Inventors: Chih-Hao Huang, Hsinchu (TW); Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 189 days.

(21) Appl. No.: 11/533,954

(22) Filed: Sep. 21, 2006

(65) Prior Publication Data

US 2008/0122124 A1    May 29, 2008

(51) Int. Cl.
*H01L 21/76* (2006.01)
*H01L 23/544* (2006.01)

(52) U.S. Cl. ............ 257/797; 438/401; 438/462; 438/42; 438/424; 438/429; 438/430; 438/700; 438/701

(58) Field of Classification Search ............ 257/797; 438/401, 462, 42, 424, 429, 430, 700, 701
See application file for complete search history.

(56) References Cited

U.S. PATENT DOCUMENTS

| | | | | |
|---|---|---|---|---|
| 3,969,749 A | * | 7/1976 | Bean | 257/527 |
| 4,172,664 A | * | 10/1979 | Charsky et al. | 356/508 |
| 6,184,151 B1 | * | 2/2001 | Adair et al. | 438/743 |
| 2006/0118974 A1 | * | 6/2006 | Kim et al. | 257/797 |
| 2006/0138410 A1 | * | 6/2006 | Lalbahadoersing et al. | 257/48 |
| 2006/0151890 A1 | * | 7/2006 | Smith et al. | 257/797 |

* cited by examiner

*Primary Examiner*—Thanh V Pham
(74) *Attorney, Agent, or Firm*—J.C. Patents

(57) ABSTRACT

An overlay mark for checking the alignment accuracy between a lower layer and a lithography process for defining an upper layer is described, including a part of the lower layer having two first x-directional trenches, two first y-directional trenches, two second x-directional trenches and two second y-directional trenches therein, and two x-directional and two y-directional photoresist bars thereover that are surrounded by the trenches and formed in the lithography process. When the lower layer is fully aligned with the lithography process, the intersection of the central line of the two first x-directional trenches and that of the two first y-directional trenches, the intersection of the central line of the two second x-directional trenches and that of the two second y-directional trenches and the intersection of the central line of the two x-directional photoresist lines and that of the two y-directional photoresist lines coincide with each other.

22 Claims, 4 Drawing Sheets

OVERLAY MARK, METHOD FOR FORMING THE SAME AND APPLICATION THEREOF

BACKGROUND OF THE INVENTION

1. Field of Invention

This invention relates to an overlay mark used in IC processes, and more particularly, to an overlay mark for checking the alignment accuracy between a lower layer and a lithography process for defining an upper layer, a method for forming the same, and the application of the same in alignment accuracy checking.

2. Description of the Related Art

As the linewidth of the IC process gets narrower, it is more important to control the critical dimension of the semiconductor device. When an IC process need to form two areas of different pattern arrangements for a layer, two exposure steps constituting a double exposure process are usually performed to the photoresist layer in respective areas to assure that the two areas are defined with predetermined critical dimensions. In order to check the alignment accuracy between the two areas of the layer and an upper layer, an overlay mark is formed prior to the patterning of the upper layer with the following steps in the prior art.

Referring to FIG. 1A, in the exposure step of a first device area 102 of a die 100 using a photomask, two y-directional bar-like exposed regions 112a and 112b are also formed in the photoresist layer 108 on a part 106 of a lower layer in a non-device area. It is noted that for simplicity, the photomask and the lower layer (patterns) and the photoresist layer patterns) in the device areas are all omitted in this figure and all of the following figures.

Referring to FIG. 1B, in the exposure step of the second device area 104, two x-directional bar-like exposed regions 114a and 114b are also formed in the photoresist layer 108 over the part 106 of the lower layer. The photoresist material in the exposed regions 112a, 112b, 114a and 114b and in the exposed regions in the device areas is removed in a subsequent development process, so that two y-directional trenches 122a and 122b and two x-directional trenches 124a and 124b will be formed in the part 106 of the lower layer in the subsequent etching process for forming the patterns of the lower layer in the device areas 102 and 104, as shown in FIG. 1C.

Referring to FIG. 1C, after the upper layer (not shown) is formed, the photoresist patterns in the device areas together with two x-directional and two y-directional photoresist bars 130 as a part of the overlay mark are simultaneously formed. The trenches 122a, 122b, 124a and 124b and the photoresist bars 130 are arranged such that when the lithography process is fully aligned with the first device area 102 in the x-direction, the central line of the two y-directional trenches 122a and 122b and that of the two y-directional photoresist bars 130 defined simultaneously with the first device area 102 coincide with each other, and when the lithography process is fully aligned with the second device area 104 in the y-direction, the central line of the two x-directional trenches 124a and 124b and that of the two x-directional photoresist bars 130 defined simultaneously with the second device area 104 coincide with each other.

Thus, the x-directional alignment accuracy between the lithography process and the first device area 102 can be checked by measuring the distance 132a/132b between the central line of the two y-directional photoresist bars 130 and the y-directional trench 122a/122b, and the y-directional alignment accuracy between the lithography process and the second device area 104 can be checked by measuring the distance 134a/134b between the central line of the two x-directional photoresist bars 130 and the x-directional trench 124a/124b.

However, using the above overlay mark cannot check the y-directional alignment accuracy between the lithography process and the first device area 102 and the x-directional alignment accuracy between the lithography process and the second device area 104, so that the function of the above overlay mark in alignment accuracy check is not complete.

SUMMARY OF THE INVENTION

This invention provides an overlay mark for checking the alignment accuracy between a lower layer and the lithography process for defining an upper layer.

This invention also provides a method for forming the above overlay mark.

This invention also provides an method for checking the alignment accuracy between a lower layer defined by a double exposure process and the lithography process for defining an upper layer, which forms the above overlay mark for the checking.

The overlay mark of this invention includes a part of a lower layer, and two x-directional and two y-directional photoresist bars. The part of the lower layer has two first x-directional trenches, two first y-directional trenches, two second x-directional trenches and two second y-directional trenches. The two x-directional and two y-directional photoresist bars are surrounded by the trenches and formed in the lithography process. When the lower layer is fully aligned with the lithography process, the intersection of the central line of the two first x-directional trenches and the central line of the two first y-directional trenches, the intersection of the central line of the two second x-directional trenches and the central line of the two second y-directional trenches and the intersection of the central line of the two x-directional photoresist bars and the central line of the two y-directional photoresist bars coincide with each other.

In some embodiments, the lower layer is defined by a first exposure step and a second exposure step, wherein the first x-directional trenches and the first y-directional trenches are defined by the first exposure step and the second x-directional trenches and the second y-directional trenches by the second exposure step. The first exposure step and the second exposure step may constitute a double exposure process, wherein the first exposure step and the second exposure step are respectively for, for example, defining an area of dense patterns and an area of isolated patterns of the lower layer. The area of dense patterns includes a memory cell array area and the area of isolated patterns a peripheral circuit area, for example. The patterns may include, for example, contact opening patterns.

In some embodiments, the two first x-directional trenches are located outside the two second x-directional trenches and the two first y-directional trenches outside the two second y-directional trenches. In an embodiment, when the lower layer is fully aligned with the lithography process, the two first x-directional trenches and the two first y-directional trenches together define a first rectangle, the two second x-directional trenches and the two second y-directional trenches together define a second rectangle, and the two x-directional and two y-directional photoresist bars define a third rectangle.

The method for forming an overlay mark of this invention is described below. In the patterning of the lower layer, two first x-directional trenches, two first y-directional trenches, two second x-directional trenches and two second y-directional trenches are formed in a part of the lower layer. In the subsequent lithography process, two x-directional and two y-directional photoresist bars are formed over the part of the lower layer surrounded by the trenches. When the lower layer is fully aligned with the lithography process, the intersection of the central line of the two first x-directional trenches and the central line of the two first y-directional trenches, the intersection of the central line of the two second x-directional trenches and the central line of the two second y-directional trenches and the intersection of the central line of the two x-directional photoresist bars and the central line of the two y-directional photoresist bars coincide with each other.

In some embodiments of the above method, the lower layer is defined by a first and a second exposure steps, the first x-directional trenches and the first x-directional trenches are defined by the first exposure step and the second x-directional trenches and the second y-directional trenches by the second exposure step. The first exposure step and the second exposure step constitute a double exposure process. The step of forming the x-directional and y-directional trenches in the part of the lower layer may include the following steps, for example. In the first exposure step, two first x-directional bar-like exposed regions and two first y-directional bar-like exposed regions are formed in the photoresist layer for defining the lower layer respectively corresponding to the two first x-directional trenches and the two first y-directional trenches. In the second exposure step, two second x-directional bar-like exposed regions and two second y-directional bar-like exposed regions are formed in the photoresist layer respectively corresponding to the two second x-directional trenches and the two second y-directional trenches. Afterwards, the photoresist material in the exposed regions is removed in a development process, followed by using the photoresist layer as the mask to etch the lower layer and removing the photoresist layer.

The method for checking alignment accuracy of this invention is described as follows. An overlay mark is formed with the following steps. In the patterning of the lower layer, two first x-directional trenches and two first y-directional trenches defined by the first exposure step are formed in a part of the lower layer, and two second x-directional trenches and two second y-directional trenches defined by the second exposure step are formed in the part of the lower layer. In the subsequent lithography process, two x-directional and two y-directional photoresist bars are formed over the part of the lower layer surrounded by the trenches. When the lower layer is fully aligned with the lithography process, the intersection of the central line of the two x-directional photoresist bars and the central line of the two y-directional photoresist bars, the intersection of the central line of the two first x-directional trenches and the central line of the two first y-directional trenches and the intersection of the central line of the two second x-directional trenches and the central line of the two second y-directional trenches coincide with each other. After the overlay mark is formed, the positions of the two x-directional and two y-directional photoresist bars relative to the trenches are measured, so as to check the x-directional alignment accuracy and the y-directional alignment accuracy between the lower layer and the photolithography process.

In some embodiments of the above-described method, the step of forming the trenches in the part of the lower layer includes the following steps, for example. In the first exposure step, two first x-directional bar-like exposed regions and two first y-directional bar-like exposed regions are formed in the photoresist layer for defining the lower layer, respectively corresponding to the two first x-directional trenches and the two first y-directional trenches. In the second exposure step, two second x-directional bar-like exposed regions and two second y-directional bar-like exposed regions are formed in the photoresist layer, respectively corresponding to the two second x-directional trenches and the two second y-directional trenches. Afterwards, the photoresist material in the exposed regions is removed in a development process, followed by using the photoresist layer as the mask to etch the lower layer and removing the photoresist layer.

By using the overlay mark of this invention, it is possible to check the x-directional alignment accuracy and the y-directional alignment accuracy between the part of the lower layer defined by the first exposure process and the upper layer defined by the subsequent lithography process and check those between another part of the lower layer defined by the second exposure process and the upper layer, so that a better effect in checking the alignment accuracy can be provided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

FIGS. 1A-1C illustrate a process flow of forming an overlay mark in the prior art, wherein FIG. 1C illustrates the overlay mark and the use thereof.

FIGS. 2A-2C illustrate a process flow of forming an overlay mark according to an embodiment of this invention, wherein FIG. 2C illustrates the overlay mark and the use thereof.

DESCRIPTION OF THE EMBODIMENTS

Figure 1A:
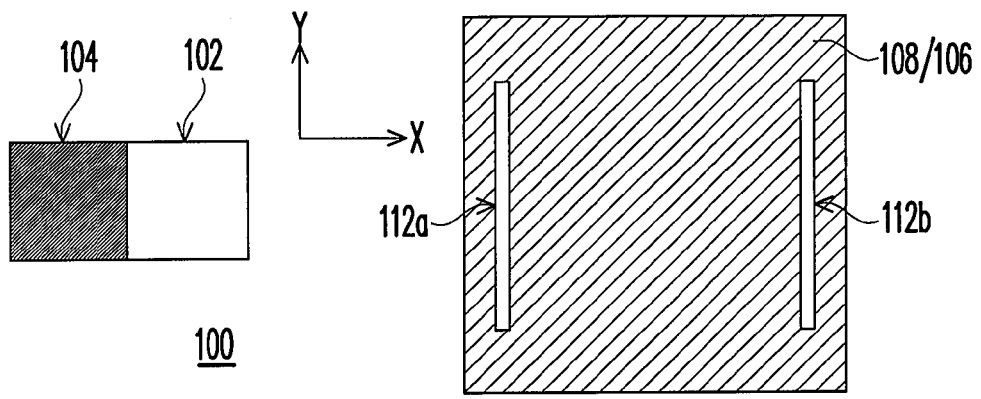
Figure 1B:
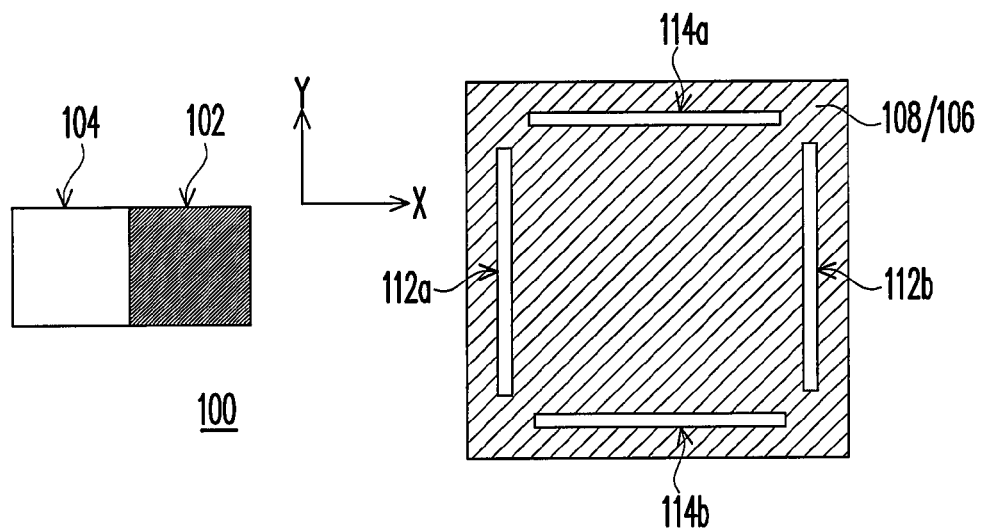
Figure 1C:
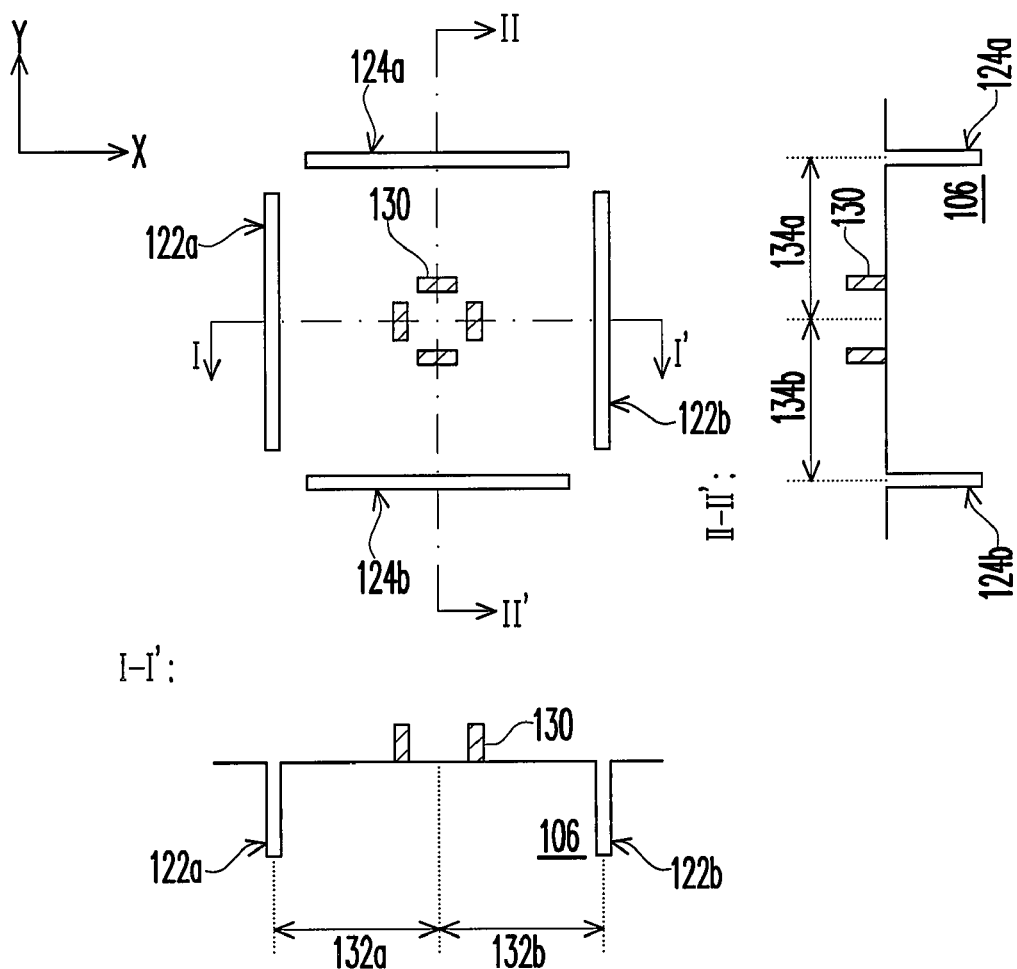
Figure 2A:
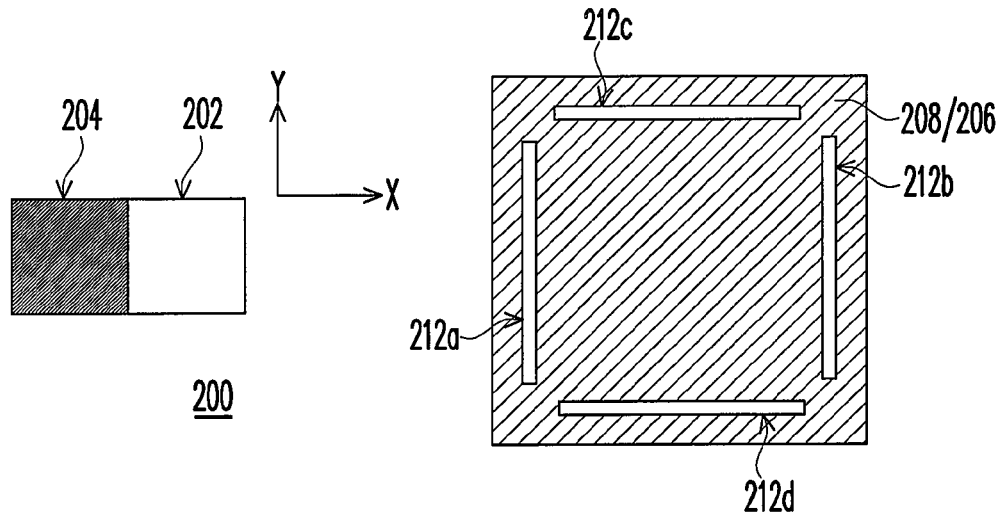
Figure 2B:
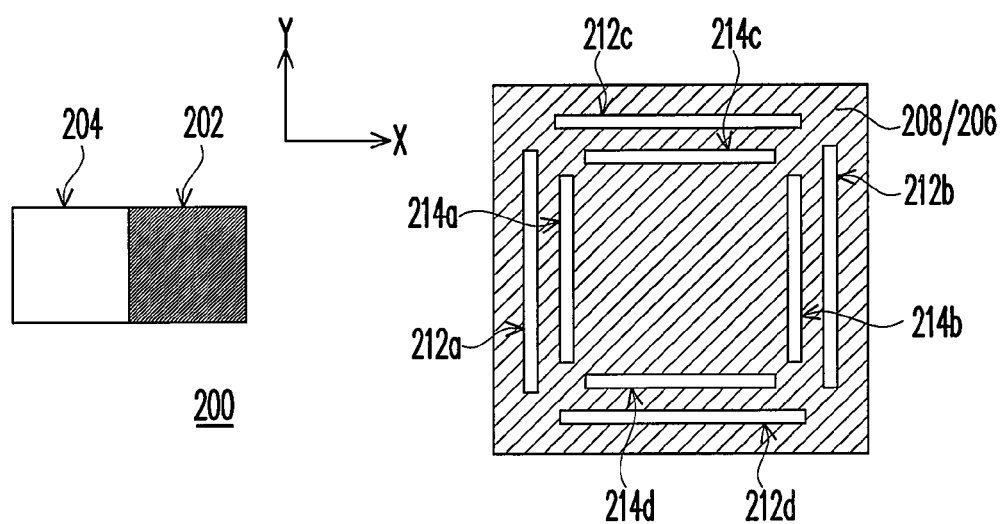
Figure 2C:
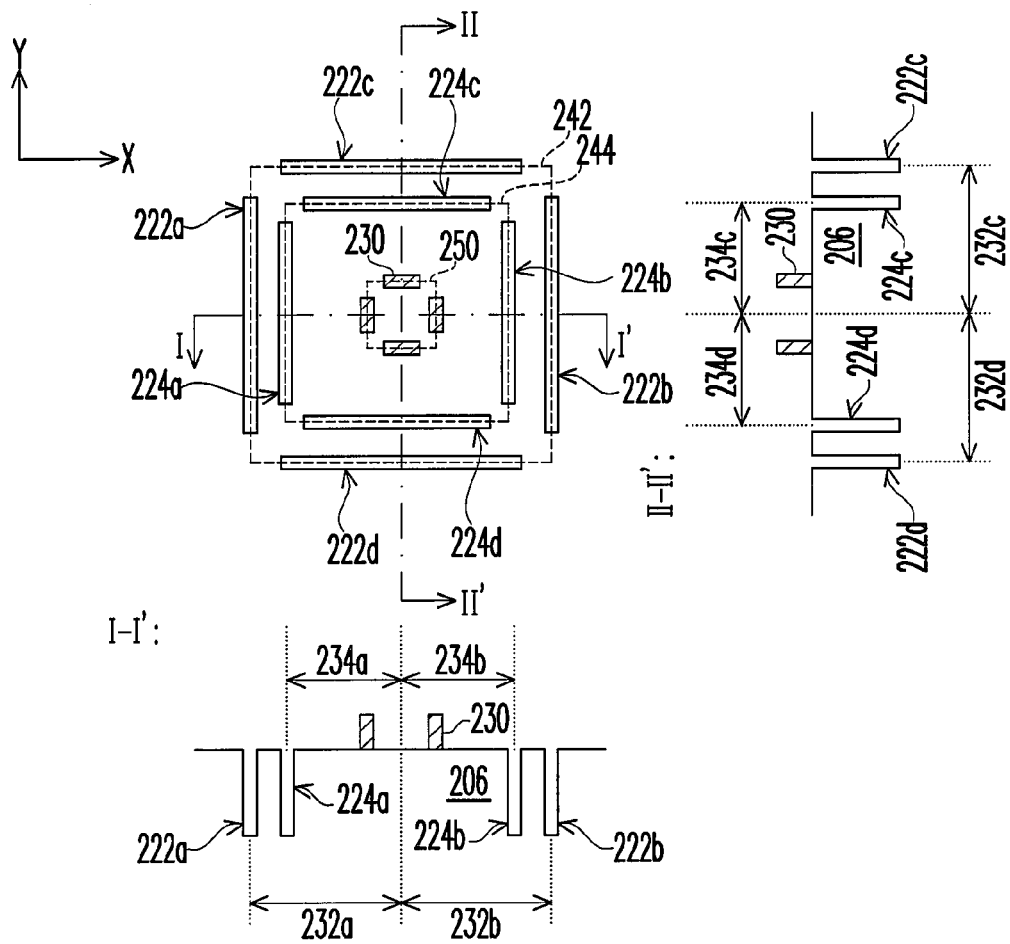

FIGS. 2A-2C illustrate a process flow of forming an overlay mark according to an embodiment of this invention, wherein FIG. 2C illustrates the overlay mark and the use thereof. Although the overlay mark in the embodiment is for checking the alignment accuracy between a lower layer defined by a double exposure process and the lithography process for defining an upper layer, the application of the overlay mark of this invention is not limited thereto. For example, the overlay mark can be used to check the alignment accuracy between a lower layer defined by any two exposure steps not constituting a double exposure process and the subsequent lithography process as well.

Referring to FIG. 2A, in the first exposure step for defining a first device area 202 of a die 200, two y-directional bar-like exposed regions 212a and 212b and two x-directional bar-like exposed regions 212c and 212d are also formed in the photoresist layer 208 on a part 206 of the lower layer in a non-device area, which is usually in the scribe line area. Except the first device area 202, the die 200 has also a second device area 204. The first device area 202 and the second device area 204 may respectively be, for example, an area of dense patterns and an area of isolated patterns. The area of dense patterns and the area of isolated patterns may respectively be, for example, a memory cell array area and a peripheral circuit area. The patterns may include contact opening patterns, for example.

Referring to FIG. 2B, in the subsequent second exposure step defining the second device area 204 with another photomask (not shown), two y-directional bar-like exposed regions 214a and 214b and two x-directional bar-like exposed regions 214c and 214d are formed in the photoresist layer 208 over the part 206 of the lower layer. The photoresist material in the exposed regions 212a-212d and 214a-214d and in the exposed regions in the device areas 202 and 204 is then removed in the subsequent development process. Thus, in the subsequent etching process patterning the lower layer in the device areas 202 and 204, corresponding first y-directional trenches 222a and 222b, first x-directional trenches 222c and 222d, second y-directional trenches 224a and 224b and second x-directional trenches 224c and 224d are formed in the part 206 of the lower layer, as shown in FIG. 2C. The trenches 222a-222d are defined by the first exposure step, while the trenches 224a-224d are defined by the second exposure step.

Referring to FIG. 2C, after an upper layer (not shown) is formed, a lithography process is conducted to form photoresist patterns of the device areas 202 and 204 and simultaneously form two x-directional and two y-directional photoresist bars 230 over the part 206 of the lower layer as a part of the overlay mark surrounded by the trenches 222a-222d and 224a-224d. In the above process, the trenches 222a-222d and 224a-224d and the photoresist bars 230 are arranged such that when the lithography process is fully aligned with the lower layer, the intersection of the central line of the two first x-directional trenches 222c and 222d and that of the two first y-directional trenches 222a and 222b, the intersection of the central line of the two second x-directional trenches 224c and 224d and that of the two second y-directional trenches 224a and 224b and the intersection of the central line of the two x-directional photoresist bars 230 and that of the two y-directional photoresist bars 230 coincide with each other.

Besides, the upper layer is, for example, a metal layer and the positions of the trenches 222a-222d and 224a-224d can be detected by means of the reflectivity of the metal layer. In an embodiment, the lower layer is a dielectric layer in which contact opening patterns are formed, and the upper layer is a metal layer that is partially filled into the contact openings and partially defined into conductive lines.

Further, the x-directional alignment accuracy between the lithography process and the lower layer in the first device area 202 may be checked by measuring the distance 232a/232b between the central line of the two y-directional photoresist bars 230 and the first y-directional trench 222a/222b. The y-directional alignment accuracy between the lithography process and the lower layer in the first device area 202 may be checked by measuring the distance 232c/232d between the central line of the two x-directional photoresist bars 230 and the first x-directional trench 222c/222d. the x-directional alignment accuracy between the lithography process and the lower layer in the second device area 204 can be checked by measuring the distance 234a/234b between the central line of the two y-directional photoresist bars 230 and the second y-directional trench 224a/224b. The y-directional alignment accuracy between the lithography process and the lower layer in the second device area 204 can be checked by measuring the distance 234c/234d between the central line of the two x-directional photoresist bars 230 and the second x-directional trench 224c/224d. Accordingly, both the x-directional alignment accuracy and the y-directional one between the lithography process and the patterns of the lower layer defined by any of the first and the second exposure steps can be checked. The alignment accuracy herein is just the alignment accuracy between the lower layer and the upper layer defined by the lithography process.

In fact, the method of using the overlay mark of this embodiment for checking the alignment accuracy between the lower layer defined by two exposure processes and the subsequent lithography process is not limited to the above described. Taking the checking of the alignment accuracy in the x-direction as a example, an alternative method includes the following steps. The position of the central line (first central line) of the first y-directional trench 222a and the adjacent second y-directional trench 224a, the position of the central line (second central line) of the first y-directional trench 222b and the adjacent second y-directional trench 224b and the position of the central line (third central line) of the two y-directional photoresist bars 230 are obtained first. Then, the distance between the first and the third central lines and the distance between the second and the third central lines are calculated and compared with each other.

In addition, a preferred arrangement of the trenches 222a-222d and 224a-224d are as shown in FIG. 2C, where the first x-directional trenches 222c and 222d are located outside the second x-directional trenches 224c and 224d while the first y-directional trenches 222a and 222b located outside the second y-directional trenches 224a and 224b. Alternatively, it is also preferred that the first x-directional trenches 222c and 222d are located inside the second x-directional trenches 224c and 224d while the first y-directional trenches 222a and 222b located inside the second y-directional trenches 224a and 224b. In other words, it is preferred that the trenches defined by the first exposure process surround those defined by the second exposure process or the latter surround the former adversely.

In a preferred embodiment, the trenches 222a-222d and 224a-224d and the two y-directional and two x-directional photoresist bars 230 are arranged such that when the lower layer is fully aligned with the lithography process, the first x-directional trenches 222c and 222d and the first y-directional trenches 222a and 222b together define a first rectangle 242, the second x-directional trenches 224c and 224d and the second y-directional trenches 224a and 224b together define a second rectangle 244, and the two x-directional and two y-directional photoresist bars 230 together define a third rectangle 250 as the smallest rectangle, wherein the centers of the three rectangles 242, 244 and 250 coincide with each other. Though the second rectangle 244 is inside the first rectangle 242 in FIG. 2C, the first rectangle defined by the trenches defined by the first exposure step may alternatively be inside the second rectangle defined by the trenches defined by the second exposure step.

It will be apparent to those skilled in the art that various modifications and variations can be made to the structure of this invention without departing from the scope or spirit of the invention. In view of the foregoing, it is intended that the specification and examples to be considered as exemplary only, with a true scope and spirit of the invention being indicated by the following claims and their equivalents.

What is claimed is:

1. An overlay mark for checking alignment accuracy between a lower layer and a lithography process for defining an upper layer, comprising:

a part of the lower layer, having two first x-directional trenches, two first y-directional trenches, two second x-directional trenches and two second y-directional trenches therein; and two x-directional photoresist bars and two y-directional photoresist bars formed in the lithography process, over the part of the lower layer and surrounded by the trenches, wherein when the lower layer is fully aligned with the lithography process, an intersection of a central line of the two first x-directional trenches and a central line of the two first y-directional trenches, an intersection of a central line of the two second x-directional trenches and a central line of the two second y-directional trenches and an intersection of a central line of the two x-directional photoresist bars and a central line of the two y-directional photoresist bars coincide with each other.

2. The overlay mark of claim 1, wherein the lower layer is defined by a first exposure step and a second exposure step, the two first x-directional trenches and the two first y-directional trenches are defined by the first exposure step, and the two second x-directional trenches and the two second y-directional trenches are defined by the second exposure step.

3. The overlay mark of claim 2, wherein the first exposure step and the second exposure step constitute a double exposure process.

4. The overlay mark of claim 3, wherein the first exposure step and the second exposure step are respectively for defining an area of dense patterns and an area of isolated patterns of the lower layer.

5. The overlay mark of claim 4, wherein the area of dense patterns comprises a memory cell array area and the area of isolated patterns a peripheral circuit area.

6. The overlay mark of claim 1, wherein the two first x-directional trenches are located outside the two second x-directional trenches and the two first y-directional trenches are located outside the two second y-directional trenches.

7. The overlay mark of claim 6, wherein when the lower layer is fully aligned with the lithography process, the two first x-directional trenches and the two first y-directional trenches together define a first rectangle, the two second x-directional trenches and the two second y-directional trenches together define a second rectangle, and the two x-directional photoresist bars and two y-directional photoresist bars together define a third rectangle.

8. A method for forming an overlay mark that is for checking alignment accuracy between a patterned lower layer and a lithography process for defining an upper layer, comprising:
during the patterning of the lower layer, forming two first x-directional trenches, two first y-directional trenches, two second x-directional trenches and two second y-directional trenches in a part of the lower layer; and
in the lithography process, forming two x-directional photoresist bars and two y-directional photoresist bars that are all located over the part of the lower layer and surrounded by the trenches,
wherein when the lower layer is fully aligned with the lithography process, an intersection of a central line of the two first x-directional trenches and a central line of the two first y-directional trenches, an intersection of a central line of the two second x-directional trenches and a central line of the two second y-directional trenches and an intersection of a central line of the two x-directional photoresist bars and a center line of the two y-directional photoresist bars coincide with each other.

9. The method of claim 8, wherein the lower layer is defined by a first and a second exposure steps, the two first x-directional trenches and the two first y-directional trenches are defined by the first exposure step, and the two second x-directional trenches and the two second y-directional trenches are defined by the second exposure step.

10. The method of claim 9, wherein the first exposure step and the second exposure step constitute a double exposure process.

11. The method of claim 10, wherein the step of forming the trenches in the part of the lower layer comprises:
in the first exposure step, forming in a photoresist layer for defining the lower layer two first x-directional bar-like exposed regions and two first y-directional bar-like exposed regions respectively corresponding to the two first x-directional trenches and the two first y-directional trenches;

in the second exposure step, forming in the photoresist layer two second x-directional bar-like exposed regions and two second y-directional bar-like exposed regions respectively corresponding to the two second x-directional trenches and the two second y-directional trenches;
in a development process, removing a photoresist material in the exposed regions;
using the photoresist layer as a mask to etch the lower layer; and
removing the photoresist layer.

12. The method of claim 10, wherein the first exposure step and the second exposure step are respectively for defining an area of dense patterns and an area of isolated patterns of the lower layer.

13. The method of claim 12, wherein the area of dense patterns comprises a memory cell array area and the area of isolated patterns a peripheral circuit area.

14. The method of claim 8, wherein the two first x-directional trenches are located outside the two second x-directional trenches, and the two first y-directional trenches are located outside the two second y-directional trenches.

15. The method of claim 14, wherein when the lower layer is fully aligned with the lithography process, the two first x-directional trenches and the two first y-directional trenches together define a first rectangle, the two second x-directional trenches and the two second y-directional trenches together define a second rectangle, and the two x-directional photoresist bars and two y-directional photoresist bars together define a third rectangle.

16. A method for checking alignment accuracy between a lower layer defined by a double exposure process and a lithography process for defining an upper layer, wherein the double exposure process comprises a first and a second exposure steps, comprising:
forming an overlay mark, comprising:
during patterning of the lower layer, forming two first x-directional trenches and two first y-directional trenches defined by the first exposure step and two second x-directional trenches and two second y-directional trenches defined by the second exposure step in a part of the lower layer; and
in the lithography process, forming two x-directional photoresist bars and two y-directional photoresist bars located over the part of the lower layer and surrounded by the trenches, wherein when the lower layer is fully aligned with the lithography process, an intersection of a central line of the two x-directional photoresist bars and a central line of the two y-directional photoresist bars, an intersection of a central line of the two first x-directional trenches and a central line of the two first y-directional trenches and an intersection of a central line of the two second x-directional trenches and a central line of the two second y-directional trenches coincide with each other; and
measuring positions of the two x-directional photoresist bars and the two y-directional photoresist bars relative to the trenches for checking the alignment accuracy in the x-direction and the alignment accuracy in the y-direction between the lower layer and the lithography process.

17. The method of claim 16, wherein the step of forming the trenches comprises:
in the first exposure step, forming in a photoresist layer for defining the lower layer two first x-directional bar-like exposed regions and two first y-directional bar-like exposed regions respectively corresponding to the two first x-directional trenches and the two first y-directional trenches;

in the second exposure step, forming in the photoresist layer two second x-directional bar-like exposed regions and two second y-directional bar-like exposed regions respectively corresponding to the two second x-directional trenches and the two second y-directional trenches;

in a development process, removing a photoresist material in the exposed regions;

using the photoresist layer as a mask to etch the lower layer; and removing the photoresist layer.

18. The method of claim 16, wherein the first exposure step and the second exposure step are respectively for defining an area of dense patterns and an area of isolated patterns of the lower layer.

19. The method of claim 18, wherein the area of dense patterns comprises a memory cell array area and the area of isolated patterns a peripheral circuit area.

20. The method of claim 19, wherein the patterns comprise contact opening patterns.

21. The method of claim 16, wherein the two first x-directional trenches are located outside the two second x-directional trenches, and the two first y-directional trenches are located outside the two second y-directional trenches.

22. The method of claim 21, wherein when the lower layer is fully aligned with the lithography process, the two first x-directional trenches and the two first y-directional trenches together define a first rectangle, the two second x-directional trenches and the two second y-directional trenches together define a second rectangle, and the two x-directional photoresist bars and two y-directional photoresist bars together define a third rectangle.

* * * * *